(12) United States Patent
Chow et al.

(10) Patent No.: US 8,592,690 B2
(45) Date of Patent: Nov. 26, 2013

(54) CIRCUIT BOARD HAVING CIRCUMFERENTIAL SHIELDING LAYER

(75) Inventors: John Chow, Saratoga, CA (US);
Yueh-Shan Shih, New Taipei (TW);
Yong-Chun Xu, Kunshan (CN);
Jian-She Hu, Kunshan (CN)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 74 days.

(21) Appl. No.: 13/241,300

(22) Filed: Sep. 23, 2011

(65) Prior Publication Data

US 2012/0247826 A1  Oct. 4, 2012

(30) Foreign Application Priority Data

Mar. 31, 2011  (CN) .......................... 2011 1 0080606

(51) Int. Cl.
*H05K 1/11* (2006.01)
(52) U.S. Cl.
USPC .......................................... 174/261; 174/262

(58) Field of Classification Search
None
See application file for complete search history.

(56) References Cited

U.S. PATENT DOCUMENTS 6,670,559 B2 * 12/2003 Centola et al. ................ 174/261
6,674,653 B1 *  1/2004 Valentine ...................... 361/818
6,777,620 B1 *  8/2004 Abe ............................... 174/255

FOREIGN PATENT DOCUMENTS

TW  I337839  2/2011

\* cited by examiner

*Primary Examiner* — Ishwarbhai Patel
(74) *Attorney, Agent, or Firm* — Wei Te Chung; Ming Chieh Chang

(57) ABSTRACT

A circuit board (100) includes a first shielding layer (20) extending horizontally, an accessorial shielding layer, a signal circuit layer (3) positioned between the first shielding layer and the accessorial shielding layer, and a circumferential shielding layer (6) surrounding the circuit board and electrically connecting with the first shielding layer and the accessorial shielding layer to improve shielding effect.

19 Claims, 4 Drawing Sheets

CIRCUIT BOARD HAVING CIRCUMFERENTIAL SHIELDING LAYER

BACKGROUND OF THE INVENTION

1. Field of the Invention

The present invention relates to a circuit board, and particularly, to a circuit board with shielding layers enclosing the signal circuit layer.

2. Description of Related Art

Taiwan Patent No. 1337839 issued on Feb. 21, 2011 discloses a circuit board. The circuit board comprises a base board with a number of circuits printed thereon, a grounding port electrically connected with the circuits and at least one conductive plate extending from one edge of the base board and electrically connecting the grounding port. The circuit board is positioned in a metallic device with the conductive plate attached to the metallic device to achieve shielding effect. However, after assembly, the circuit board occupies too much space due to the metallic device. It is inconvenient for the layout of other components. Besides, a punching mold is needed to manufacture the metallic device with high cost.

Hence, an improved circuit board is desired to overcome the above problems.

SUMMARY OF THE INVENTION

A primary object of the present invention is to provide an circuit board having shielding layers enclosing the signal circuit layer to get better shielding effect with lower cost.

To achieve the aforementioned object, a circuit board includes a first shielding layer extending horizontally, a accessorial shielding layer, a signal circuit layer positioned between the first shielding layer and the accessorial shielding layer, and a circumferential shielding layer surrounding the circuit board and electrically connecting with the first shielding layer and the accessorial shielding layer.

The foregoing has outlined rather broadly the features and technical advantages of the present invention in order that the detailed description of the invention that follows may be better understood. Additional features and advantages of the invention will be described hereinafter which form the subject of the claims of the invention.

DETAILED DESCRIPTION OF THE INVENTION

Figure 1:
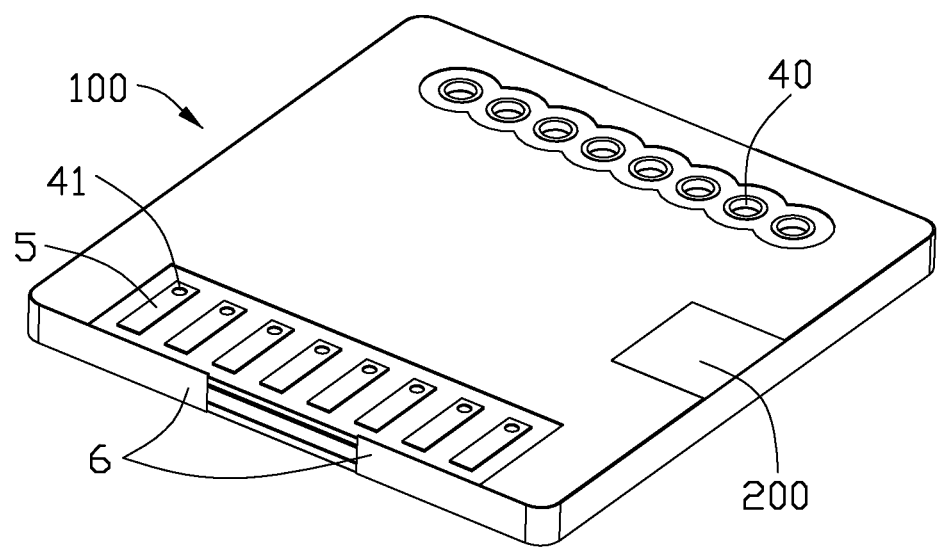
FIG. 1 is an assembled perspective view of a circuit board in accordance with the embodiment of the present invention.
Figure 2:
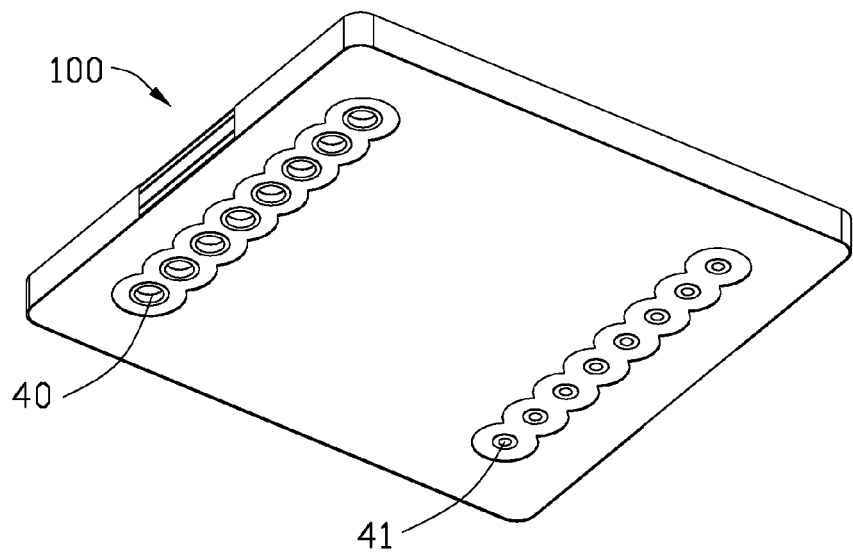
FIG. 2 is another perspective view of the circuit board as shown in FIG. 1.

Reference will now be made to the drawing figures to describe the present invention in detail. Referring to FIGS. 1-4, a circuit board 100 in accordance with the embodiment of the present invention comprises a first shielding layer 20, a signal circuit layer 3, an accessorial shielding layer including a second shielding layer 21 and a third shielding layer 22, a plurality of first through holes 40, a plurality of second through holes 41, a plurality of conductive pads 5 and a circumferential shielding layer 6. The signal circuit layer 3 comprises a plurality of signal traces 30. The signal circuit layer 3 is located between the first shielding layer 20 and the second shielding layer 21, and the signal circuit layer 3 is also located between the first shielding layer 20 and the third shielding layer 22 so as to get a better shielding effect. In other embodiment of the present invention, the accessorial shielding layer could only include the second shielding layer 21 or the third shielding layer 22.

The circumferential shielding layer 6 surrounds the circuit board 100, thereby electrically connecting the first shielding layer 20, the second shielding layer 21 and the third shielding layer 22. The circumferential shielding layer 6 is separated into a first part 60 and a second part 61. Both the first part 60 and the second part 61 electrically connect the first shielding layer 20, the second shielding layer 21, and the third shielding layer 22, respectively, to form a shielding system. In the embodiment of the present invention, the circuit board 100 is shaped as a rectangle; both the first part 60 and the second part 61 are identical and surround the side walls of the circuit board 100 together. Before the circumferential shielding layer 6 comes into being, opposite sides of the circuit board 100 are connected with strips in order to position the circuit board 100 on the plating equipment (not shown). After forming the circumferential shielding layer 6 by plating process with lower cost, the strips are cut off with a pair of non-plating areas dividing the circumferential shielding layer 6 into the first part 60 and the second part 61. Besides the plating process, the shielding layer 6 also could be made by spraying with metallic material onto the side walls or by a metallic paper attached on the side walls. The circumferential shielding layer 6 extends along the upright direction and surrounds the first shielding layer 20, the second shielding layer 21, the third shielding layer 22 and the signal circuit layer 3. Therefore, besides the upper and lower shielding layer (the first shielding layer 20 and the second shielding layer 21 or the first shielding layer 20 and the third shielding layer 22), the signal circuit layer 3 is also shielded by the circumferential shielding layer 6 in transverse direction to the first shielding layer 20.

Referring to FIGS. 1-4, the first through holes 40 electrically connect with corresponding signal traces 30 and run through the first shielding layer 20, the second shielding layer 21 and the third shielding layer 22 but not electrically connecting with the first shielding layer 20, the second shielding layer 21 and the third shielding layer 22. The first through holes 40 are used for the signal traces 30 to connect with other components. The first shielding layer 20 may define or designate a grounding area 200 thereon. Because the first shielding layer 20, the second shielding layer 21 and the third shielding layer 22 electrically connect with each other, once the grounding area 200 realizes grounding, the other two shielding layers also realize grounding. In the embodiment of the present invention, all the shielding layers 20, 21, 22 electrically connect with each other by the circumferential shielding layer 6. In other embodiment such as defining a through hole could electrically connect all the shielding layers 20, 21, 22 as well. The conductive pads 5 are defined on the surface of the circuit board 100 adjacent to the first shielding layer 20 and electrically connect with corresponding signal traces 30 via the second through holes 41. The conductive pads 5 are exposed to the outside of the circuit board 100 and connect other components with the circuit board 100. The second through holes 41 run through the second shielding layer 21 and the third shielding layer 22 but not electrically connect with the second shielding layer 21 and the third shielding layer 22.

Figure 3:
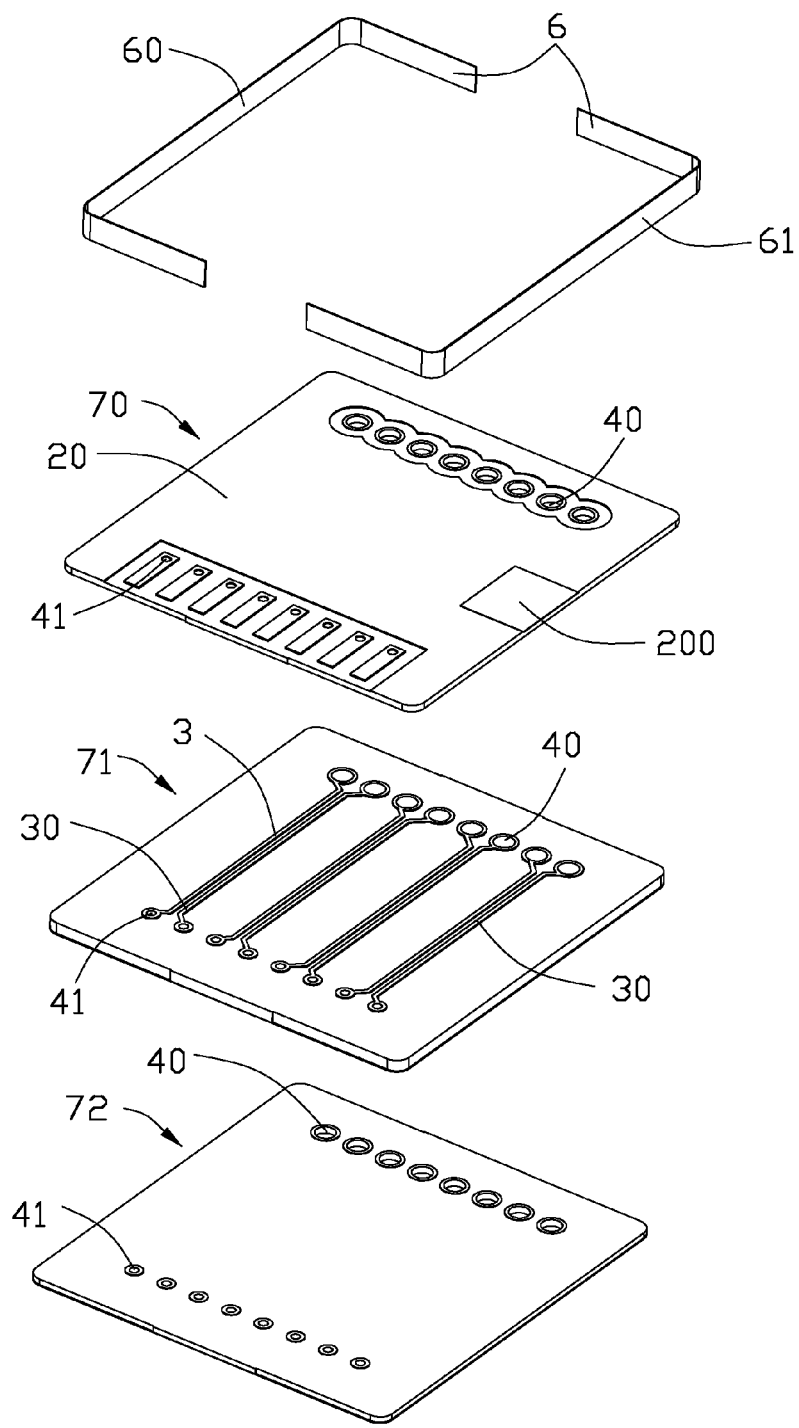
FIG. 3 is an exploded perspective view of the circuit board as shown in FIG. 1.
Figure 4:
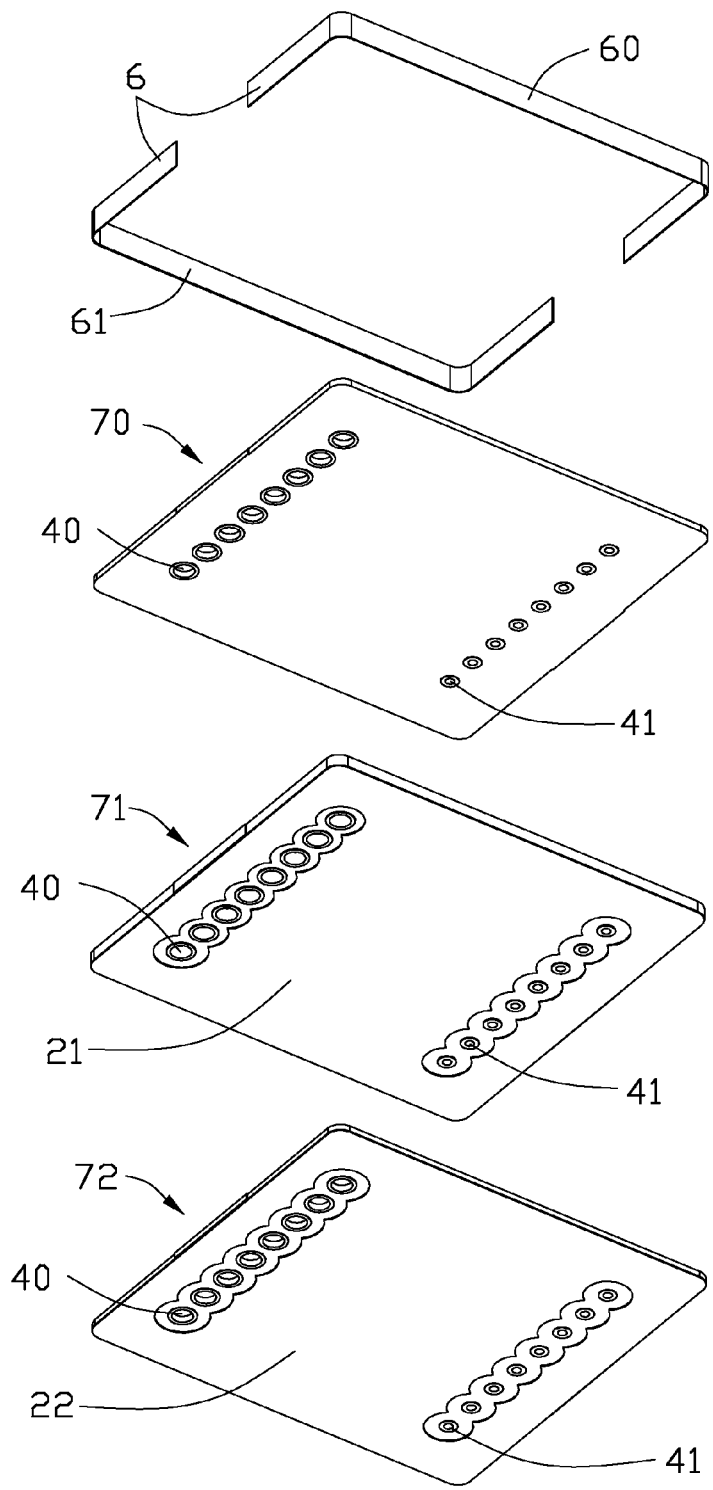
FIG. 4 is another exploded perspective view of the circuit board as shown in FIG. 2.

Referring to FIGS. 3 and 4, the circuit board 100 is formed by a plurality of boards stacked one by one. The circuit board 100 comprises a first board 70, a second board 71 and a third board 72. The second board 71 is sandwiched between the first board 70 and the third board 72. The first shielding layer 20 and the conductive pads 5 are defined on the first board 70. The signal circuit layer 3 and the second shielding layer 21 are defined on the second board 71 and located on opposite sides of the second board 71. The third shielding layer 22 is defined on the third board 72.

The accessorial shielding layer could include only the second shielding layer 21 or the third shielding layer 22. The circuit board 100 includes the first shielding layer 20, the signal circuit layer 3 and the accessorial shielding layer (the second shielding layer 21 or the third shielding layer 22). The signal circuit layer 3 is positioned between the first shielding layer 20 and the accessorial shielding layer with the circumferential shielding layer 6 surrounding the circuit board 100 to obtain better shielding effect.

However, the disclosure is illustrative only, changes may be made in detail, especially in matter of shape, size, and arrangement of parts within the principles of the invention.

What is claimed is:

1. A circuit board comprising:
   a first shielding layer extending horizontally;
   an accessorial shielding layer;
   a signal circuit layer disposed between the first shielding layer and the accessorial shielding layer, said signal circuit layer having a plurality of signal traces; and
   a circumferential shielding layer surrounding the circuit board and electrically connecting with the first shielding layer and the accessorial shielding layer, wherein said circumferential shielding layer is separated into a first part and a second part,
   the first part surrounding one side of the circuit board, each side of the first part has an extension, the extension surrounding the other oppositely sides,
   the second part surrounding one side of the circuit board, each side of the second part has an extension, the extension surrounding said other oppositely sides,
   the other oppositely sides are only partly surrounded by the extensions of the first part and the second part with a gap.

2. The circuit board as claimed in claim 1, wherein said circumferential shielding layer is formed by plating.

3. The circuit board as claimed in claim 1, wherein said circumferential shielding layer is formed by spraying with metallic material.

4. The circuit board as claimed in claim 1, wherein said circumferential shielding layer is formed by a metallic paper attached to the circuit board.

5. The circuit board as claimed in claim 1, wherein said circuit board comprises a first board, a second board and a third board stacked one by one, the second board being located between the first board and the third board, the first shielding layer being defined on the first board, the signal circuit layer being defined on the second board.

6. The circuit board as claimed in claim 5, wherein said accessorial shielding layer comprises a second shielding layer located on the second board opposite to the signal circuit layer.

7. The circuit board as claimed in claim 5, wherein said accessorial shielding layer comprises a third shielding layer positioned on the third board.

8. The circuit board as claimed in claim 1, wherein a plurality of first through holes are provided electrically connecting with the signal traces, the first through holes running through the first shielding layer and the accessorial shielding layer but not electrically connecting with the first shielding layer and the accessorial shielding layer.

9. The circuit board as claimed in claim 1, wherein said first shielding layer defines a grounding area thereon and electrically connected with the accessorial shielding layer by the circumferential shielding layer.

10. The circuit board as claimed in claim 1, wherein a plurality of conductive pads are provided exposed outwardly adjacent to the first shielding layer and electrically connected with the signal traces.

11. The circuit board as claimed in claim 10, wherein a plurality of second through holes are provided connecting the conductive pads to the signal traces, the second through holes running through the accessorial shielding layer but not electrically connecting with the accessorial shielding layer.

12. A printed circuit board comprising:
    first, second and third horizontal rectangular parts stacked upon one another under condition that the second horizontally parts is located between the first horizontal part and the third horizontal part,
    the first part and the third part electrically linked to each other and essentially providing shielding effect in a vertical direction while the second part essentially providing at least signature transmission, and
    a vertical part circumferentially surrounding a periphery of a combination of said first, second and third horizontal parts to provide shielding effect horizontally; wherein
    said vertical part laterally extends along and covers four sides of said combination while leaving at least one gap on one of said four sides to laterally expose said first, second and third parts partially to an exterior.

13. The printed circuit board as claimed in claim 12, wherein at least one of said first part and said third part defines soldering pads on a corresponding outer surface for signal communication with an external part.

14. The printed circuit board as claimed in claim 13, wherein said corresponding outer surface is further equipped with at least a ground pad for grounding communication with the external part.

15. The printed circuit board as claimed in claim 12, wherein said first, second and third horizontal parts are horizontal layers.

16. The printed circuit board as claimed in claim 15, wherein said vertical part is a vertical layer.

17. The printed circuit board as claimed in claim 12, wherein said first, second and third parts are the horizontal boards.

18. The printed circuit board as claimed in claim 17, wherein said vertical part is either a metallic coating or a metallic tape.

19. The printed circuit board as claimed in claim 12, wherein the periphery of the combination of the first, second and third horizontal parts is not completely surrounded by the vertical part but with a gap.

* * * * *